United States Patent [19]
Takemae et al.

[11] Patent Number: 4,597,059
[45] Date of Patent: Jun. 24, 1986

[54] DYNAMIC SEMICONDUCTOR MEMORY DEVICE

[75] Inventors: Yoshihiro Takemae, Yokohama; Tomio Nakano, Kawasaki; Kimiaki Sato, Tokyo, all of Japan

[73] Assignee: Fujitsu Limited, Kawasaki, Japan

[21] Appl. No.: 535,987

[22] Filed: Sep. 26, 1983

[30] Foreign Application Priority Data

Sep. 29, 1982 [JP] Japan ............................ 57-170682

[51] Int. Cl.$^4$ .............................................. G11C 7/00
[52] U.S. Cl. ................................... 365/154; 365/189
[58] Field of Search ............... 365/189, 202, 203, 204, 365/205, 149, 154

[56] References Cited

U.S. PATENT DOCUMENTS 3,810,124  5/1974  Hoffman et al. .................. 365/149
4,074,237  2/1978  Spampinato ....................... 365/189
4,360,902  11/1982 Proebsting ......................... 365/189
4,369,503  1/1983  Isogai ................................. 365/189

OTHER PUBLICATIONS

Anderson, K. L., "Shared Bit Line Sensing for Two-Device Cell", IBM Tech. Disclosure Bulletin, vol. 20, No. 11A, 4/78 pp. 4295–4296.

Primary Examiner—Terrell W. Fears
Assistant Examiner—Guy M. Miller
Attorney, Agent, or Firm—Staas & Halsey

[57] ABSTRACT

A dynamic semiconductor memory device comprising: (1) one-transistor one-capacitor type memory cells connected between word lines and bit lines and (2) flip-flops, each flip-flop being connected between a pair of word lines to clamp an unselected word line in the pair of word lines to the low voltage of a power source, thereby preventing a subsequent erroneous reading operation as a result of an increase in potential of the unselected word line.

11 Claims, 9 Drawing Figures

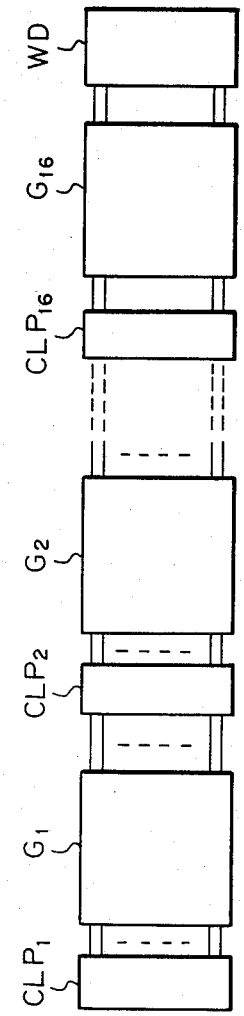
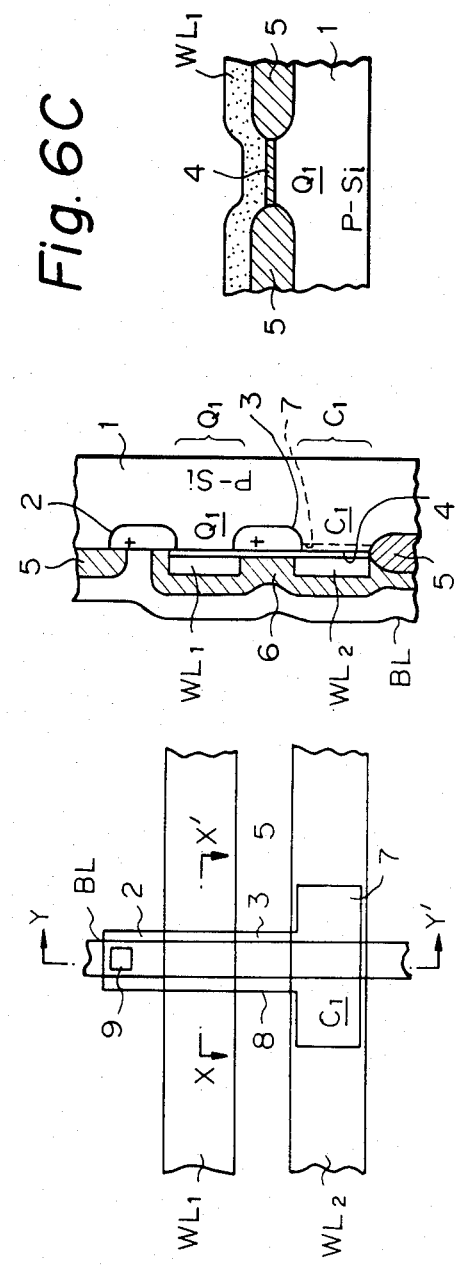
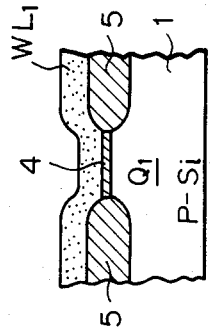

DYNAMIC SEMICONDUCTOR MEMORY DEVICE

BACKGROUND OF THE INVENTION

1. Field of the Invention

The present invention relates to a dynamic semiconductor memory device having memory cells of a one-transistor one-capacitor type and more particularly to a dynamic semiconductor memory device in which the clamping of the potentials of unselected word lines is guaranteed.

2. Description of the Prior Art

Generally, a dynamic semiconductor memory device such as a one-transistor one-capacitor type dynamic random access memory (DRAM) has memory cells each consisting of one metal-insulator semiconductor (MIS) transistor having a drain connected to a bit line, a gate connected to a word line and a source, and also having one capacitor. The capacitor is usually a MOS capacitor, having one electrode connected to the source of the MIS transistor. The potential of another electrode opposed to the above-mentioned capacitor electrode (hereinafter referred to as an opposed electrode) is preferably fixed at the low voltage $V_{SS}$ of a power supply.

In a conventional technique for simplifying the process of manufacturing opposed electrodes, unselected word lines are used as opposed electrodes because unselected word lines are clamped, at one end thereof, to the low voltage $V_{SS}$ by word decoders. When the opposed electrodes of the cell capacitors are independently formed without utilizing unselected word lines, and additional conductive layer, for example, a polycrystalline layer, is used for the opposed electrodes, thereby rendering the manufacturing process more complex.

In a conventional one-transistor one-capacitor DRAM, there exists the possibility of the destruction of data stored in a memory cell adjacent to a selected memory cell during memory cell selection (described in detail later with reference to the drawing).

SUMMARY OF THE INVENTION

An object of the present invention is to provide a dynamic semiconductor memory device in which data destruction during memory cell selection is prevented, thereby preventing an error in a subsequent reading operation.

To attain the above object, a dynamic semiconductor memory device includes one-transistor one-capacitor type memory cells connected between word lines and bit lines; and flip-flops, each flip-flop being connected between a pair of word lines to clamp an unselected word line in the pair of word lines to the low voltage of a power source.

BRIEF DESCRIPTION OF THE DRAWINGS

The above object and advantages thereof will be more apparent from the following description of the embodiments when read in conjunction with the accompanying drawings.

FIG. 5 is a block diagram of a DRAM according to another embodiment of the present invention;

FIG. 6A is a plan view of the DRAM of FIG. 3 showing the structure thereof;

FIG. 6B is a cross-sectional view of FIG. 6A taken along the line X-X' of FIG. 6A;

FIG. 6C is a cross-sectional view of FIG. 6A taken along the line Y-Y' of FIG. 6A;

DESCRIPTION OF THE PREFERRED EMBODIMENTS

Figure 1:
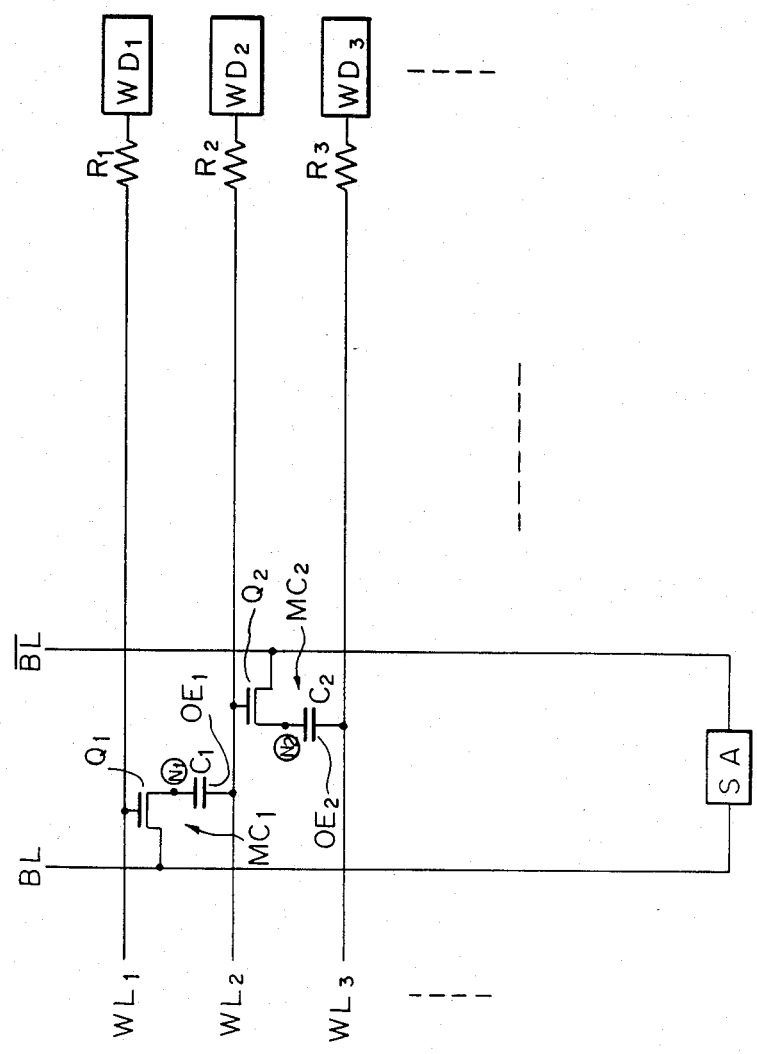
FIG. 1 is a circuit diagram of an example of a conventional DRAM.

Before describing the embodiments of the present invention, a conventional DRAM and the problems involved therein are described with reference to FIGS. 1 and 2. FIG. 1 is an example of a conventional DRAM. In FIG. 1, $WL_1$, $WL_2$, ... are word lines formed by a polysilicon layer; BL and $\overline{BL}$ are one pair of bit lines (other bit lines are omitted in the drawing); SA is a sense amplifier; $WD_1$, $WD_2$, ... are word decoders; $MC_1$ and $MC_2$ are memory cells; $Q_1$ and $Q_2$ are metal-oxide semiconductor (MOS) transistors having silicon gates; and $C_1$ and $C_2$ are MOS capacitors. One of the transistors and one of the capacitors constitute a memory cell. In this DRAM, the opposed electrode $OE_1$ of the capacitor $C_1$ in the memory cell $MC_1$ is connected to the word line $WL_2$ adjacent to the word line $WL_1$. The memory cell $MC_1$ is selected by raising the word line $WL_1$ to a high potential. The opposed electrode $OE_2$ of the capacitor $C_2$ in the memory cell $MC_2$, which is selected by raising the potential of the word line $WL_2$, is connected to the next word line $WL_3$ adjacent to the word line $WL_2$, and so on. Thus, the adjacent word line $WL_2$, $WL_3$, ... are used as opposed electrodes $OE_1$, $OE_2$, ... of the MOS capacitors $C_1$, $C_2$, ...

When a memory cell, for example, $MC_1$, is selected, the selected word line $WL_1$ is driven to a voltage higher than the high voltage $V_{CC}$ of the power supply by the word decoder $WD_1$. The unselected word lines $WL_2$ and $WL_3$ are substantially fixed to the low voltage $V_{SS}$, which is generally equal to 0 V. If a P-type semiconductor substrate is employed, an N-type inversion layer is formed immediately under one part of a word line by means of an ion injection technique and so on to form a MOS capacitor such as $C_1$ between that part of the word line and the inversion layer. The inversion layer is formed to contact the drain or the source of the MOS transistor. Therefore, the unselected word lines can be used as the opposed electrodes of the MOS capacitors.

In the above-described conventional DRAM, however, there exist some problems, which are explained with reference to FIG. 2. For example, assume that the cell $MC_1$ is storing a "0", i.e., the node $N_1$ at the connection of the source of the MOS transistor $Q_1$ and the MOS capacitor $C_1$ is 0 V. When the word line $WL_1$ is selected at time $t=t_0$, the node $N_1$ is charged by the bit line BL, which was precharged to the voltage $V_{CC}$. Accompanied by an increease in potential at the node $N_1$, the potential of the opposed electrode $OE_1$ and, therefore, of the word line $WL_2$ adjacent to the word line $WL_1$ is increased via the MOS capacitor $C_1$. It is preferable that the potential of the unselected word line $WL_2$ not be increased since the word line $WL_2$ is not being selected at this time. Although the word decoder $WD_2$ clamps the word line $WL_2$ at one end thereof to the voltage $V_{SS}$ (generally 0 V), an increase in potential of the unselected word line $WL_2$ is caused since the clamping effect is not satisfactorily obtained due to the resistances $R_1$, $R_2$, ... (FIG. 1) of the word lines because the word lines are composed of polycrystalline silicon which has a larger resistance than metal wiring. Thus, the potential of the word line $WL_2$ is increased temporarily and locally by a boost via the above-mentioned capacitor $C_1$. If the potential of the word line $WL_2$ increases to more than the threshold voltage of the MOS transistor $Q_2$, the memory cell $MC_2$ is erroneously turned on. If the state of the memory cell $MC_2$ is "1", i.e., if the node $N_2$ is at the voltage $V_{CC}$, no problem occurs. If, however, the state of the memory cell $MC_2$ is "0", i.e., if the node $N_2$ is at the voltage $V_{SS}$, when the transistor $Q_2$ is turned on, a current flows from the bit line $\overline{BL}$, which has been precharged to the voltage $V_{CC}$, to the node $N_2$, resulting in an increase of the potential at the node $N_2$. This is the reason why the level of the node $N_2$ in FIG. 2 increases. Even after the potential of the word line $WL_2$ is lowered to the voltage $V_{SS}$, by the word decoder $WD_2$, connected to one end of the word line $WL_2$, which clamps the word line $WL_2$, the potential of the node $N_2$ does not again assume the voltage $V_{SS}$.

The operation of reading the data stored in a memory cell, for example, $MC_2$, is, as is well known, carried out by precharging the bit lines $BL$ and $\overline{BL}$ to the voltage $V_{CC}$ and then selecting the word line $WL_2$ to raise the potential thereof. This turns on the MOS transistor $Q_2$ which has a drain connected to the bit line $\overline{BL}$ and functions as a transfer gate. Simultaneous with the turning on of the MOS transistor $Q_2$, a transfer gate of a dummy cell (not shown) connected to the bit line $BL$ is turned on. The dummy cell stores a reference amount of charge. Thus, the charges on the bit lines $BL$ and $\overline{BL}$ flow into the dummy cell and the real cell $MC_2$, respectively. The difference between the charge which flows into the real cell $MC_2$ and the charge which flows into the dummy cell, that is, the potential difference between the bit lines $BL$ and $\overline{BL}$, is detected by the sense amplifier $SA$. If, as was previously mentioned, the potential of the node $N_2$ is erroneously increased, the amount of charge which flows from the bit line $\overline{BL}$ to the real cell $MC_2$ is too small to indicate that the memory cell $MC_2$ is storing "0". Thus, a reading error may occur.

Figure 3:
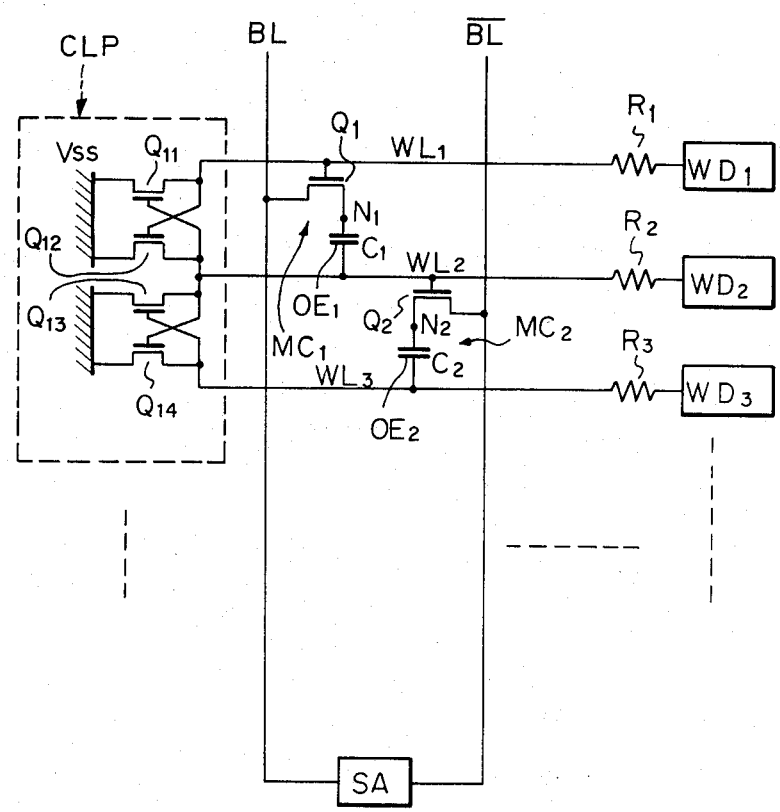
FIG. 3 is a circuit diagram of a DRAM according to an embodiment of the present invention.

FIG. 3 illustrates an embodiment of the present invention, wherein the same portions as in FIG. 1 are denoted by the same reference numerals and symbols. In FIG. 3, the element enclosed within the broken lines is a clamping circuit CLP, which is an element in this embodiment not found in the conventional circuit of FIG. 1. The structure of the clamping circuit CLP is simple, that is, between the left end of the word line $WL_1$ and the left end of the word line $WL_2$ (the open ends of the word lines $WL_1$ and $WL_2$ in FIG. 1) and the voltage $V_{SS}$, cross-coupled transistors $Q_{11}$ and $Q_{12}$, comprising a flip-flop, are connected. Similarly, between the left end of the word line $WL_2$ and the left end of the word line $WL_3$ and the voltage $V_{SS}$, transistors $Q_{13}$ and $Q_{14}$, comprising a flip-flop, are connected. In such a structure, when the word line $WL_1$ is selected, the transistor $Q_{12}$ is turned on so that the left end of the unselected word line $WL_2$ adjacent to the word line $WL_1$ is clamped at the voltage $V_{SS}$ and the other end thereof is clamped at the voltage $V_{SS}$ by the word decoder $WD_2$.

Figure 2:
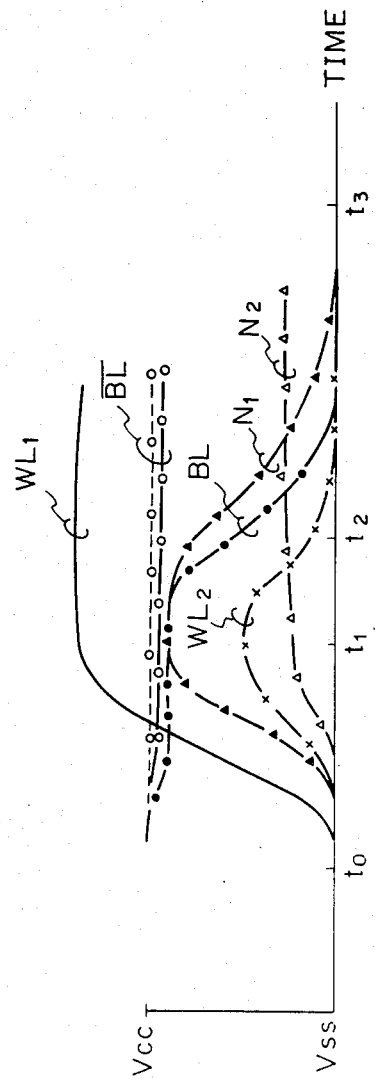
FIG. 2 is a waveform diagram showing the operation of the DRAM of FIG. 1.
Figure 4:
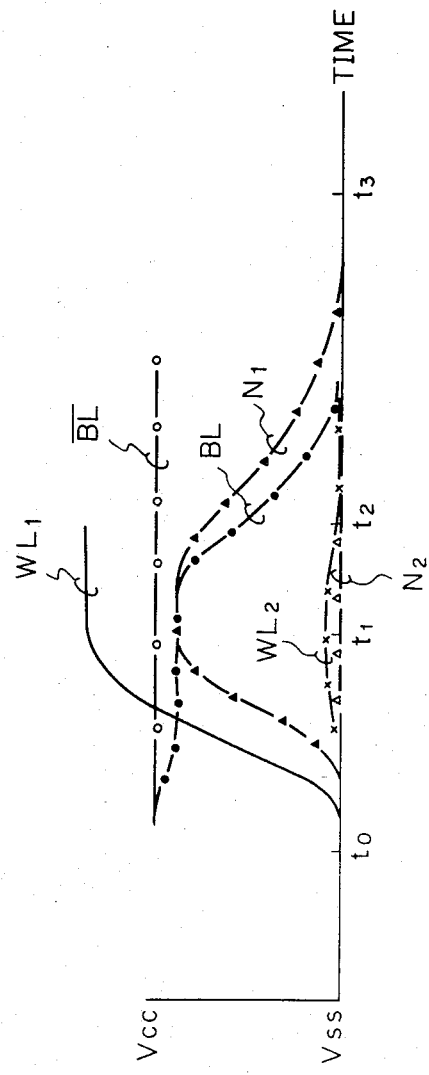
FIG. 4 is a waveform diagram showing the operation of the DRAM of FIG. 3.

Accordingly, as can be seen in FIG. 4, although the changes in potential of the selected word line $WL_1$ and the node $N_1$ are the same as those in FIG. 2, the potential increase of the unselected word line $WL_2$ can be kept small so that the MOS transistor $Q_2$ is not turned on, thereby preventing inversion of the data stored in the memory cell $MC_2$. Similarly, when the word line $WL_2$ is selected, the transistor $Q_{14}$ is turned on so that the left end of the word line $WL_3$ is clamped at the voltage $V_{SS}$, thereby preventing inversion of the data stored in a memory cell connected to the word line $WL_3$.

It is apparent that the effectiveness of this clamping circuit CLP can be increased by providing a plurality of clamping circuits CLP along each word line. Therefore, a second embodiment provides one clamping circuit for each of the sections of a word line, as illustrated in FIG. 5. FIG. 5 is a block diagram of a 64K DRAM having a memory-cell matrix of 256×256 bits, the memory-cell matrix being divided into 16 groups $G_1$ through $G_{16}$ in the word line direction. Clamping circuits $CLP_1$ through $CLP_{16}$ are inserted between adjacent groups and on the side of the DRAM opposite the word drivers $WD_n$. Since one clamping circuit, including one flip-flop consisting the transistors $Q_{11}$ and $Q_{12}$ (FIG. 3), for example, can be formed within a 12 μm width, the total width of the clamping circuits is only about 200 μm.

FIGS. 6A through 6C are diagrams of the structure of the memory cell $MC_1$ in the DRAM of FIG. 3. FIG. 6A is a plan pattern, FIG. 6B a cross section along the line X-X' of FIG. 6A and FIG. 6C a cross section along the line Y-Y' of FIG. 6A. In these figures, 1 is a P-type silicon substrate, 2 and 3 are N+-type diffusion layers which act as source and drain regions of the transistor $Q_1$, 4 is a gate oxidation film, 5 is a field oxidation film, 6 is an insulating layer between layers, 7 is an N-type inversion layer formed by means of an ion implantation technique and so on, 8 represents a boundary of the field oxidation film 5 and 9 is a contact hole connecting the bit line BL of aluminum to the N+-type diffusion layer 2. The word lines $WL_1$ and $WL_2$ are polycrystalline silicon layers. The word line $WL_2$ adjacent to the word line $WL_1$ is used as the opposed electrode $OE_1$ of the MOS capacitor $C_1$. The bit line BL is an aluminum (Al) layer which is in ohmic contact with one of the N+-type layers, i.e., the diffusion layer 2, of the transistor $Q_1$. To obtain the desired capacitance of the capacitor $C_1$, the inversion layer 7 is extended under the word line $WL_2$.

Figure 7:
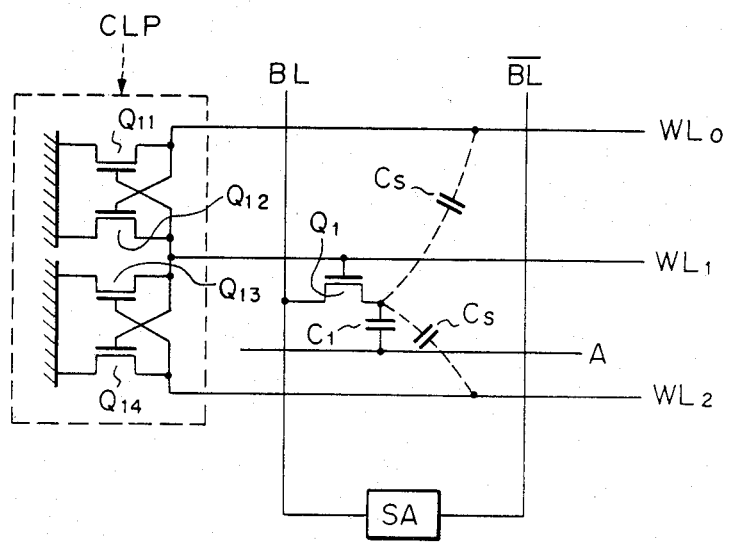
FIG. 7 is a circuit diagram of a DRAM according to yet another embodiment of the present invention.

Note the present invention is not restricted to the DRAM of the above-described embodiments. For example, the present invention can also be applied to a DRAM in which an independent opposed electrode of a memory cell is provided but in which, due to parasitic capacitances, the level of an unselected word line is increased. FIG. 7 is an equivalent circuit diagram of part of a DRAM according to yet another embodiment of the present invention, wherein $C_S$ represents parasitic capacitances which cause unselected word line $WL_0$ and $WL_2$, for example, to have an increased potential, and A is an independent opposed electrode layer. Each flip-flop in the clamping circuit CLP is connected between the adjacent word lines $WL_0$ and $WL_1$ or $WL_1$ and $WL_2$. Instead of connecting the flip-flop in the clamping circuit between adjacent word lines, the flip-flop may be connected between any pair of word lines having parasitic capacitances, such as those illustrated in FIG. 7.

As was described above, in a DRAM according to the present invention, there is an advantage in that the possibility of information in unselected cells being destroyed is greatly reduced by adding simple circuits to the memory device whereby the potentials of unselected word lines in a one-transistor one-capacitor type DRAM can effectively be clamped to the unselected level.

We claim:

1. A dynamic semiconductor memory device, operatively connected to a power source having a low voltage terminal providing a low voltage, comprising:
   word lines;
   bit lines;
   memory cells operatively connected to said word line and said bit lines; and
   flip-flops, each of said flip-flops operatively connected between an associated pair of said word lines and connected to the power source, for clamping one word line of the associated pair of said word lines to the low voltage of the power source in direct response to a selected state of the other word line of the associated pair of word lines.

2. A dynamic semiconductor memory device, operatively connected to a power source having a low voltage terminal providing a low voltage, comprising:
   word lines;
   bit lines; and
   flip-flops, operatively connected to an associated pair of said word lines, each of said flip-flops comprising:
      a first transistor having a drain operatively connected to a first word line of the associated pair of said word lines, a gate operatively connected to a second word line of the associated pair of said word lines and a source operatively connected to the low voltage terminal of the power source; and
      a second transistor having a drain operatively connected to the second word line of the associated pair of said word lines, a gate operatively connected to the first word line of the associated pair of said word lines, and a source operatively connectable to the low voltage terminal of the power source.

3. A dynamic semiconductor memory device as set forth in claim 2, wherein each of the associated pair of said word lines is operatively connected to more than one flip-flop.

4. A dynamic semiconductor memory device as set forth in claim 1, 2 or 3, wherein each of said memory cells comprises:
   a transfer gate transistor having a gate operatively connected to one of said word lines, a drain and a source, one of the drain and the source operatively connected to one of said bit lines; and
   a capacitor having a first electrode operatively connected to the other of the source and the drain of said transfer gate transistor not connected to one of said bit lines and a second electrode.

5. A dynamic semiconductor memory device as set forth in claim 4, wherein said word lines in the associated pair of said word lines are adjacent to each other.

6. A dynamic semiconductor memory device as set forth in claim 5, wherein the second electrode of said capacitor is operatively connected to one of said word lines of the associated pair of said word lines.

7. A dynamic semiconductor memory device as set forth in claim 5,
   further comprising electrode lines, and
   wherein the second electrode of said capacitor is operatively connected to one of said electrode lines.

8. A dynamic semiconductor memory device as set forth in claim 7, wherein a parasitic capacitance is formed between the first electrode of said capacitor and the associated pair of said word lines.

9. A dynamic semiconductor memory device, comprising:
   a memory cell array having word lines arranged in pairs; and
   clamping means, operatively connected to the word lines, for clamping one of the word lines in an associated pair of the word lines at an unselected voltage in response to a selected state on the other word line in the associated pair of the word lines.

10. A dynamic semiconductor memory device as recited in claim 9, wherein said memory cell array is divided into groups and said clamping means comprises clamping circuits, one of each of said clamping circuits operatively connected to the word lines of each of the memory cell array groups.

11. A dynamic seiconductor memory device as recited in claim 9, wherein said clamping means comprises flip-flops corresponding to and operatively connected between each adjacent pair of the word lines and oepratively connected to the unselected voltage.

* * * * *